(12) United States Patent
Mukunoki et al.

(10) Patent No.: US 10,790,813 B2
(45) Date of Patent: Sep. 29, 2020

(54) DRIVE CIRCUIT FOR POWER SEMICONDUCTOR ELEMENT

(71) Applicant: Mitsubishi Electric Corporation, Chiyoda-ku (JP)

(72) Inventors: Yasushige Mukunoki, Chiyoda-ku (JP); Takashi Masuhara, Chiyoda-ku (JP); Takeshi Horiguchi, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/620,092

(22) PCT Filed: May 17, 2018

(86) PCT No.: PCT/JP2018/019024
§ 371 (c)(1),
(2) Date: Dec. 6, 2019

(87) PCT Pub. No.: WO2019/021590
PCT Pub. Date: Jan. 31, 2019

(65) Prior Publication Data
US 2020/0212906 A1    Jul. 2, 2020

(30) Foreign Application Priority Data

Jul. 28, 2017 (JP) ................................. 2017-146886

(51) Int. Cl.
*H03K 17/687* (2006.01)
*H03K 17/082* (2006.01)
(Continued)

(52) U.S. Cl.
CPC ........... *H03K 17/082* (2013.01); *G01R 31/27* (2013.01); *H02M 1/08* (2013.01); *H03K 17/18* (2013.01); *H03K 2217/0027* (2013.01)

(58) Field of Classification Search
CPC ............. H03K 17/063; H03K 17/0822; H03K 17/04123; H03K 2217/0036; H03K 17/687
(Continued)

(56) References Cited

U.S. PATENT DOCUMENTS

2010/0231269 A1*  9/2010  Nakatake ......... H03K 17/08128
                                                    327/109
2014/0085762 A1*  3/2014  Shimano ................. H02M 1/08
                                                    361/91.6
(Continued)

FOREIGN PATENT DOCUMENTS

EP    3 076 549 A1   10/2016
JP    11-330935 A    11/1999
(Continued)

OTHER PUBLICATIONS

International Search Report dated Jun. 12, 2018 in PCT/JP2018/019024 filed on May 17, 2018, 2 pages.

*Primary Examiner* — Anh Q Tra
(74) *Attorney, Agent, or Firm* — Xsensus LLP

(57) ABSTRACT

A drive circuit for a power semiconductor element according to the present disclosure includes: a control command unit that outputs a turn-on command for a power semiconductor element; a gate voltage detection unit that detects a gate voltage applied to a gate terminal after the control command unit outputs the turn-on command; a differentiator that subjects the gate voltage detected by the gate voltage detection unit to time differentiation; and a determination unit that determines, based on the gate voltage detected by the gate voltage detection unit and a differential value by the differentiator, whether the power semiconductor element is in a short-circuit state or not.

10 Claims, 7 Drawing Sheets

(51) Int. Cl.
*H03K 17/18* (2006.01)
*H02M 1/08* (2006.01)
*G01R 31/27* (2006.01)

(58) Field of Classification Search
USPC .................................................. 327/427, 434
See application file for complete search history.

(56) References Cited

U.S. PATENT DOCUMENTS

2015/0381167 A1* 12/2015 Sicard .................. H03K 17/687
                                                         318/139
2018/0115310 A1*  4/2018 Horiguchi .......... H03K 17/0822
2020/0127657 A1*  4/2020 Masuhara ............... H02M 1/00

FOREIGN PATENT DOCUMENTS

| | | |
|---|---|---|
| JP | 2008-54375 A | 3/2008 |
| JP | 2012-244365 A | 12/2012 |
| JP | 2015-53749 A | 3/2015 |
| WO | WO 2015/079492 A1 | 6/2015 |

* cited by examiner

DRIVE CIRCUIT FOR POWER SEMICONDUCTOR ELEMENT

TECHNICAL FIELD

The present disclosure relates to a drive circuit for a power semiconductor element, and more particularly to a drive circuit having functions of detecting a short-circuit state of a power semiconductor element and protecting the power semiconductor element.

BACKGROUND ART

When a short-circuit state occurs in a power semiconductor element such as an insulated gate bipolar transistor (IGBT) and a metal oxide semiconductor field effect transistor (MOSFET), a high current flows therethrough, which may cause thermal destruction of the power semiconductor element. Accordingly, there is a need to provide functions of detecting a short-circuit state of the power semiconductor element and protecting the power semiconductor element.

As a drive circuit having functions of detecting a short-circuit state of a power semiconductor element and protecting the power semiconductor element, for example, Japanese Patent Laying-Open No. 2015-53749 (PTL 1) discloses a configuration in which a turn-on command is output to a power semiconductor element, and subsequently, an amount of electric charge supplied to a gate terminal of the power semiconductor element and a gate voltage applied to the gate terminal are detected, to thereby determine based on the detected amount of electric charge and the detected gate voltage whether the power semiconductor element is in a short-circuit state or not.

CITATION LIST

Patent Literature

PTL 1: Japanese Patent Laying-Open No. 2015-53749

SUMMARY OF INVENTION

Technical Problem

The drive circuit disclosed in the above-mentioned PTL 1 employs a configuration in which the short-circuit state of the power semiconductor element is determined based on the detection values of the amount of electric charge and the gate voltage, thereby allowing an immediate detection of the short-circuit state of the power semiconductor element as compared with the conventional technique by which a determination operation is performed based on the detection value of the collector voltage in the power semiconductor element.

However, the drive circuit disclosed in PTL 1 is required to include: a gate voltage detection unit for detecting a gate voltage; and an electric charge amount detection unit for detecting the amount of electric charge. This electric charge amount detection unit is configured to detect the gate current flowing into the gate terminal or the voltage corresponding to the gate current, thereby calculating the amount of electric charge. This causes a problem that the configuration of the entire drive circuit becomes complicated, so that the device is increased in size and cost.

The present invention has been made to solve the above-described problems. An object of the present invention is to provide a drive circuit for a power semiconductor element, by which a short-circuit state of the power semiconductor element can be speedily detected in a simple configuration.

Solution to Problem

A drive circuit for a power semiconductor element according to the present disclosure is a drive circuit for a power semiconductor element having a first terminal, a second terminal, and a gate terminal. The drive circuit includes a control command unit, a gate voltage detection unit, a differentiator, and a determination unit. The control command unit outputs a turn-on command for the power semiconductor element. The gate voltage detection unit detects a gate voltage applied to the gate terminal after the control command unit outputs the turn-on command. The differentiator subjects the gate voltage detected by the gate voltage detection unit to time differentiation. The determination unit determines, based on the gate voltage detected by the gate voltage detection unit and a differential value by the differentiator, whether the power semiconductor element is in a short-circuit state or not.

Advantageous Effects of Invention

The present disclosure can provide a drive circuit for a power semiconductor element, by which a short-circuit state of the power semiconductor element can be speedily detected in a simple configuration.

DESCRIPTION OF EMBODIMENTS

Figure 1:
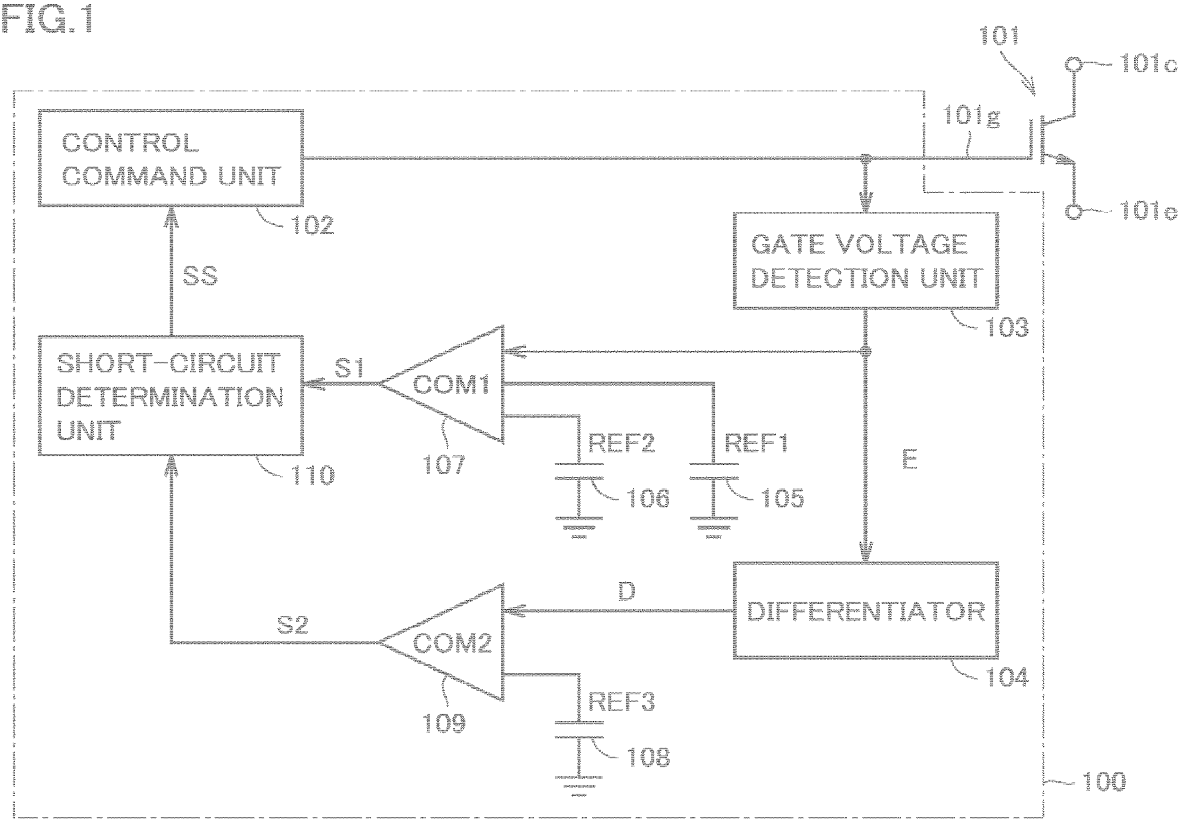
FIG. 1 is a diagram showing the configuration of a power semiconductor element and a drive circuit therefor according to the first embodiment of the present invention.

The embodiments of the present invention will be hereinafter described in detail with reference to the accompanying drawings. In the following description, the same or corresponding components in the accompanying drawings will be designated by the same reference characters, and the description thereof will not be basically repeated.

First Embodiment

FIG. 1 is a diagram showing the configuration of a power semiconductor element and a drive circuit therefor according to the first embodiment of the present invention. FIG. 1 shows an IGBT as a power semiconductor element 101, which is however not necessarily limited to an IGBT but may be a self-arc-extinguishing type semiconductor element such as a MOSFET. Power semiconductor element 101 is included in a power converter such as an inverter for converting direct-current (DC) power into alternating-current (AC) power, and a rectifier for converting AC power into DC power.

Power semiconductor element 101 has a collector terminal 101c, an emitter terminal 101e, and a gate terminal 101g. Collector terminal 101c corresponds to one example of the "first terminal" in the present invention while emitter terminal 101e corresponds to one example of the "second terminal". The voltage applied to collector terminal 101c is higher than the voltage applied to emitter terminal 101e.

Referring to FIG. 1, drive circuit 100 serves as a circuit that drives power semiconductor element 101, and includes a control command unit 102, a gate voltage detection unit 103, a differentiator 104, a first reference value generation circuit 105, a second reference value generation circuit 106, a first comparator 107, a third reference value generation circuit 108, a second comparator 109, and a short-circuit determination unit 110.

Upon reception of an ON command from outside, control command unit 102 outputs a gate command (turn-on command) to gate terminal 101g of power semiconductor element 101. The gate command (turn-on command) serves to bring power semiconductor element 101 into a conductive state (an ON state) (hereinafter referred to as "turn on"). Thereby, power semiconductor element 101 is turned on and brought into a conductive state.

Upon reception of an OFF command from outside, control command unit 102 outputs a gate command (turn-off command) to gate terminal 101g of power semiconductor element 101. The gate command (turn-off command) serves to bring power semiconductor element 101 into a cut-off state (an OFF state) (hereinafter referred to as "turn off"). Thereby, power semiconductor element 101 is turned off and brought into a cut-off state.

After reception of the turn-on command from control command unit 102, gate voltage detection unit 103 detects the gate voltage applied to gate terminal 101g of power semiconductor element 101. Gate voltage detection unit 103 outputs a signal showing a gate voltage E that has been detected.

First reference value generation circuit 105 generates a first reference value REF1 (unit [V]).

Second reference value generation circuit 106 generates a second reference value REF2 (unit [V]). Second reference value REF2 is greater than first reference value REF1 (REF1<REF2).

First comparator 107 compares gate voltage E detected by gate voltage detection unit 103 with each of first reference value REF1 and second reference value REF2, and outputs a signal S1 showing a comparison result. When gate voltage E is higher than first reference value REF1 and lower than second reference value REF2 (that is, REF1<E<REF2), signal S1 is at an "H (logic high)" level. On the other hand, when gate voltage E is equal to or less than first reference value REF1 (that is, E≤REF1) or when gate voltage E is equal to or greater than second reference value REF2 (that is, E≥REF2), signal S1 is at an "L (logic low)" level.

Differentiator 104 subjects gate voltage E detected by gate voltage detection unit 103 to time differentiation and outputs a differential value D. Differential value D is represented by D=dE/dt using gate voltage E.

Third reference value generation circuit 108 generates a third reference value REF3 (unit [V/s]).

Second comparator 109 compares differential value D by differentiator 104 with third reference value REF3, and outputs a signal S2 showing a comparison result. When differential value D is greater than third reference value REF3 (that is, D>REF3), signal S2 is at an "H" level. When differential value D is equal to or less than third reference value REF3 (that is, D≤REF3), signal S2 is at an "L" level.

Short-circuit determination unit 110 (a determination unit) computes a logical product of signal S1 output from first comparator 107 and signal S2 output from second comparator 109, thereby determining whether power semiconductor element 101 is in a short-circuit state or not. Short-circuit determination unit 110 outputs a signal SS that shows the determination result to control command unit 102.

When both signal S1 and signal S2 each are at an "H" level, signal SS is at an "H" level showing that power semiconductor element 101 is in a short-circuit state. In other words, when gate voltage E is higher than first reference value REF1 and lower than second reference value REF2 (REF1<E<REF2) and when differential value D is greater than third reference value REF3 (D>REF3), signal SS is at an "H" level. On the other hand, when one of signal S1 and signal S2 is at an "L" level, signal SS is at an "L" level showing that power semiconductor element 101 is in a normal state.

Upon reception of signal SS at an "H" level from short-circuit determination unit 110, control command unit 102 outputs a turn-off command to power semiconductor element 101 in order to cut off power semiconductor element 101.

In addition, when power semiconductor element 101 is turned off upon reception of the turn-off command from control command unit 102, gate voltage E falls. In this case, when gate voltage E becomes equal to or less than first reference value REF1, signal S1 output from first comparator 107 changes to an "L" level. Thus, signal SS that is a logical product of signal S1 and signal S2 also eventually changes to an "L" level. Thereby, short-circuit determination unit 110 erroneously determines that power semiconductor element 101 is not in a short-circuit state. Upon reception of signal SS at an "L" level from short-circuit determination unit 110, control command unit 102 outputs a turn-on command again, thereby preventing cutting-off of power semiconductor element 101.

In order to avoid such a problem, control command unit 102 has a function of holding signal SS of an "H" level upon reception of this signal SS from short-circuit determination unit 110. Thereby, when it is determined that power semiconductor element 101 is in a short-circuit state, power semiconductor element 101 is cut off according to the turn-off command. Thus, also in the case where gate voltage E falls to be equal to or less than first reference value REF1, control command unit 102 continuously outputs a turn-off command. Therefore, protection against the arm short-circuit can be reliably ensured without interfering with the cut-off operation for protecting power semiconductor element 101.

As described above, drive circuit 100 according to the first embodiment is configured to determine whether power semiconductor element 101 is in a short-circuit state or not based on gate voltage E and its differential value D in the turn-on operation of power semiconductor element 101. Such a configuration can be implemented by utilizing the feature that the relation between the gate voltage and its differential value in the turn-on operation is different between the normal state and the arm short-circuit state in power semiconductor element 101, as will be described below.

Figure 2:
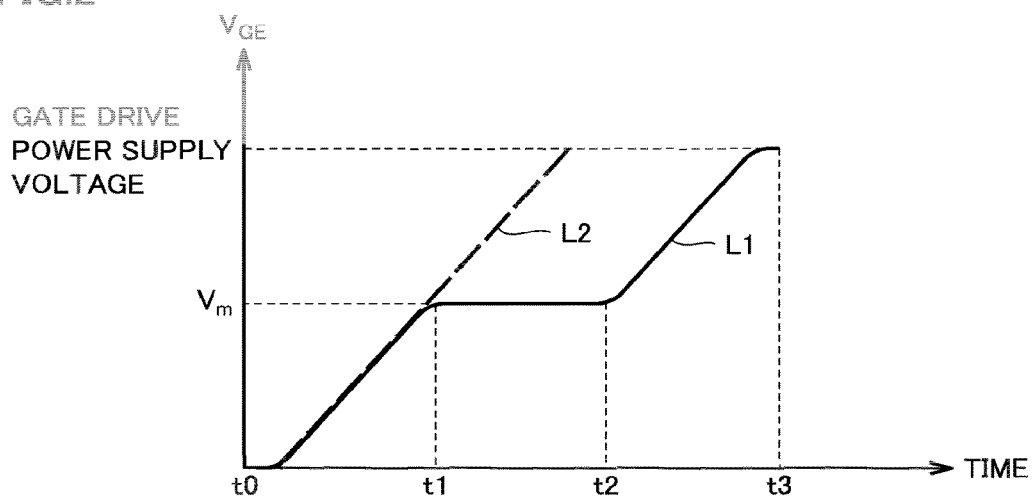
FIG. 2 is a diagram showing a waveform of a gate voltage in a turn-on operation in an IGBT in each of a normal state and an arm short-circuit state.

FIG. 2 is a diagram showing a waveform of a gate voltage $V_{GE}$ in the turn-on operation in an IGBT in each of the normal state and the arm short-circuit state. In the figure, a solid line L1 shows a waveform of gate voltage $V_{GE}$ in the turn-on operation in the normal state while a dashed line L2 shows a waveform of gate voltage $V_{GE}$ in the turn-on operation in the arm short-circuit state.

As shown in FIG. 2, in the normal state, when a turn-on command is output to the gate terminal of the IGBT at time t0, gate voltage $V_{GE}$ rises. In the IGBT, the capacitance occurring with respect to the gate terminal includes: a parasitic capacitance component that occurs between the gate terminal and the collector terminal (hereinafter referred to as a "gate-collector capacitance $C_{GC}$"); and a parasitic capacitance component that occurs between the gate terminal and the emitter terminal (hereinafter referred to as a "gate-emitter capacitance $C_{GE}$"). Gate-collector capacitance $C_{GC}$ is equivalent to a feedback capacitance in the IGBT. Gate-collector capacitance $C_{GC}$ and gate-emitter capacitance $C_{GE}$ are connected in parallel with respect to the gate terminal.

When a voltage is applied to the gate terminal at time t0, gate-emitter capacitance $C_{GE}$ is charged and gate voltage $V_{GE}$ gradually rises. The time period from time t0 to time t1 corresponds to a charging time period of gate-emitter capacitance $C_{GE}$.

Then, when gate voltage $V_{GE}$ exceeds a threshold voltage $V_{th}$ at time t1, the IGBT is started to be turned on. When the IGBT is turned on, a current starts to flow therethrough and the voltage at the collector terminal starts to decrease. In the time period between time t1 and t2, most of the gate current flows through gate-collector capacitance $C_{GC}$, but a current does not flow through gate-emitter capacitance $C_{GE}$. Accordingly, gate voltage $V_{GE}$ does not rise but is kept in a constant state.

The time period during which gate voltage $V_{GE}$ is kept constant as in the time period between time t1 and time t2 is referred to as a "Miller period". Also, this constant voltage value (equivalent to $V_m$ in the figure) is referred to as a "Miller voltage". The length of the Miller period is set in accordance with gate-collector capacitance $C_{GC}$. In other words, when gate-collector capacitance $C_{GC}$ becomes smaller, the Miller period becomes shorter. Also, when gate-collector capacitance $C_{GC}$ becomes larger, the Miller period becomes longer.

After the end of the Miller period (at and after time t2), gate voltage $V_{GE}$ rises to a gate drive power supply voltage while charging gate-emitter capacitance $C_{GE}$. The time period between time t2 and time t3 corresponds to the charging time period of gate-emitter capacitance $C_{GE}$.

On the other hand, in the arm short-circuit state, collector-emitter voltage $V_{CE}$ hardly changes while being kept in a high-voltage state, and the feedback capacitance (gate-collector capacitance $C_{GC}$) remains at an approximately constant value. As a result, no current flows through gate-collector capacitance $C_{GC}$, so that no Miller period appears. Consequently, gate voltage $V_{GE}$ rises all at once to the gate drive power supply voltage.

Thus, in the IGBT, between the normal state and the arm short-circuit state, there is a significant difference as to whether a Miller period appears or not in the waveform of gate voltage $V_{GE}$ in the turn-on operation. Since gate voltage $V_{GE}$ is kept at a constant value during a Miller period, a differential value ($dV_{GE}/dt$) obtained by subjecting gate voltage $V_{GE}$ to time differentiation is ideally zero. Therefore, as shown in FIG. 3, also in the relation between gate voltage $V_{GE}$ and its differential value, a significant difference is to appear between the normal state and the arm short-circuit state.

Figure 3:
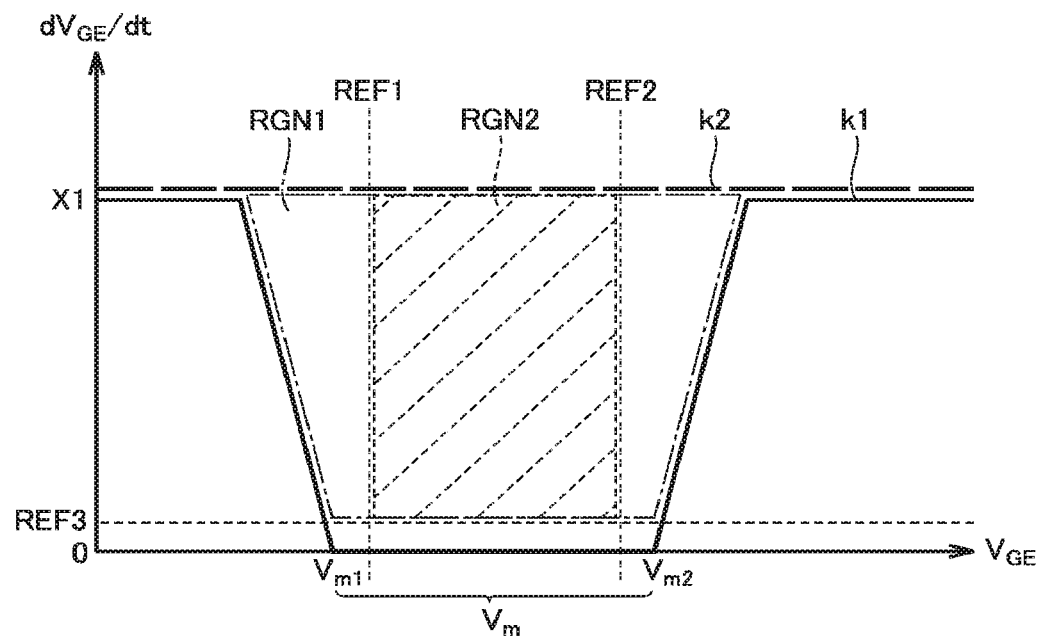
FIG. 3 is a diagram showing the relation between the gate voltage and its differential value in the turn-on operation in the IGBT in each of the normal state and the arm short-circuit state.

FIG. 3 is a diagram showing the relation between gate voltage $V_{GE}$ and its differential value ($dV_{GE}/dt$) in the turn-on operation in the IGBT in each of the normal state and the arm short-circuit state. A solid line k1 in the figure shows the relation between gate voltage $V_{GE}$ and its differential value (a gate voltage-differential value curve) in the normal state. A dashed line k2 in the figure shows the relation between gate voltage $V_{GE}$ and its differential value (a gate voltage-differential value curve) in the arm short-circuit state.

In FIG. 3, the relation shown by solid line k1 is derived using a differential value obtained by subjecting the waveform of gate voltage $V_{GE}$ shown by solid line L1 in FIG. 2 to time differentiation. In addition, in gate voltage $V_{GE}=V_m$, Miller voltage $V_m$ is set to have a fixed width ($V_{m1} \leq V_m \leq V_{m2}$). This is based on the feature that Miller voltage $V_m$ varies depending on the current value flowing through the IGBT. When the current value is relatively small, Miller voltage $V_m$ has a relatively low voltage value. When the current value is relatively large, Miller voltage $V_m$ has a relatively high voltage value.

In the normal state, the differential value before and after the Miller period is a value close to a positive value X1. Also, the differential value during the Miller period is a value close to zero. Thus, in the relation shown by solid line k1, the differential value becomes a value close to zero when gate voltage $V_{GE}$ is a Miller voltage $V_m$.

On the other hand, the relation shown by dashed line k2 is derived using a differential value obtained by subjecting the waveform of gate voltage $V_{GE}$ shown by dashed line L2 in FIG. 2 to time differentiation. In the arm short-circuit state, gate voltage $V_{GE}$ rises all at once to the gate drive power supply voltage. Accordingly, in the relation shown by dashed line k2, the differential value is kept in an approximately constant state with respect to gate voltage $V_{GE}$.

In FIGS. 2 and 3, the IGBT has been described with regard to the relation between the gate voltage and its differential value in the turn-on operation. However, as will be described later with reference to FIGS. 4 and 5, the same tendency as that in the IGBT can be observed also in the SiC-MOSFET.

Figure 4:
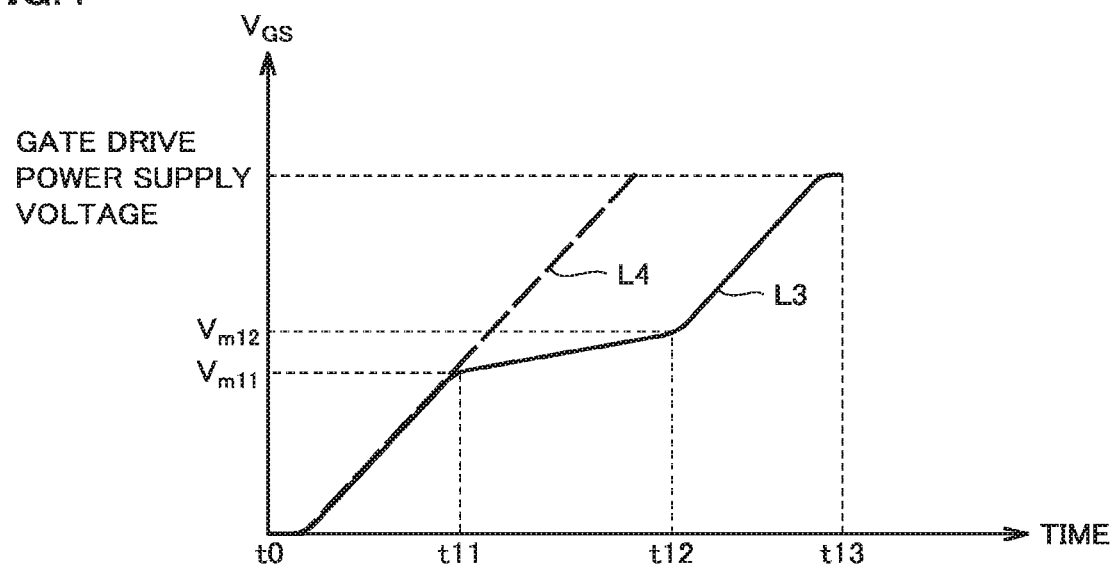
FIG. 4 is a diagram showing a waveform of a gate voltage in a turn-on operation in an SiC-MOSFET in each of the normal state and the arm short-circuit state.

FIG. 4 is a diagram showing a waveform of a gate voltage $V_{GS}$ in a turn-on operation in a SiC-MOSFET in each of the normal state and the arm short-circuit state. Solid line L3 in the figure shows the waveform of gate voltage $V_{GS}$ in the normal state while dashed line L4 in the figure shows the waveform of gate voltage $V_{GS}$ in the turn-on operation in the arm short-circuit state.

As shown in FIG. 4, in the normal state, when a turn-on command is output to the gate terminal of the SiC-MOSFET at time t0, gate voltage $V_{GS}$ rises. In the SiC-MOSFET, the capacitance that occurs with respect to the gate terminal includes: a parasitic capacitance component that occurs between the gate terminal and the drain terminal (hereinafter referred to as a "gate-drain capacitance $C_{GD}$"); and a parasitic capacitance component that occurs between the gate terminal and the source terminal (hereinafter referred to as a "gate-source capacitance $C_{GS}$"). Gate-drain capacitance $C_{GD}$ and gate-source capacitance $C_{GS}$ are connected in parallel with respect to the gate terminal.

When a voltage is applied to the gate terminal at time t0, gate-source capacitance $C_{GS}$ is first charged, and then, gate voltage $V_{GS}$ gradually rises. The time period between time t0 and time t11 corresponds to the charging time period of gate-source capacitance $C_{GS}$. When gate voltage $V_{GE}$ exceeds a threshold voltage $V_{th1}$, the SiC-MOSFET is started to be turned on. When the SiC-MOSFET is turned on, a current starts to flow therethrough and the voltage at the drain terminal starts to decrease. In order to charge gate-drain capacitance $C_{GD}$, a current starts to flow toward gate-drain capacitance $C_{GD}$. The time period between time t11 and time t12 corresponds to a gate current propagation time period of gate-drain capacitance $C_{GD}$.

In this time period, unlike the IGBT, most of the gate current flows into gate-drain capacitance $C_{GD}$ and a part of the current flows also into gate-source capacitance $C_{GS}$. Thus, gate-source capacitance $C_{GS}$ is also charged concurrently with charging of gate-drain capacitance $C_{GD}$, with the result that gate voltage $V_{GS}$ gently rises. In the specification of the present application, the time period during which gate voltage $V_{GS}$ gently rises from a Miller voltage $V_{m11}$ to a Miller voltage $V_{m12}$ as in the time period between time t11 and time t12 in FIG. 4 is referred to as a Miller period of an SiC-MOSFET.

On the other hand, in the arm short-circuit state, drain-source voltage $V_{DS}$ hardly changes while being kept in a high-voltage state. As a result, no Miller period appears, and gate voltage $V_{GS}$ rises all at once to a gate drive power supply voltage.

Figure 5:
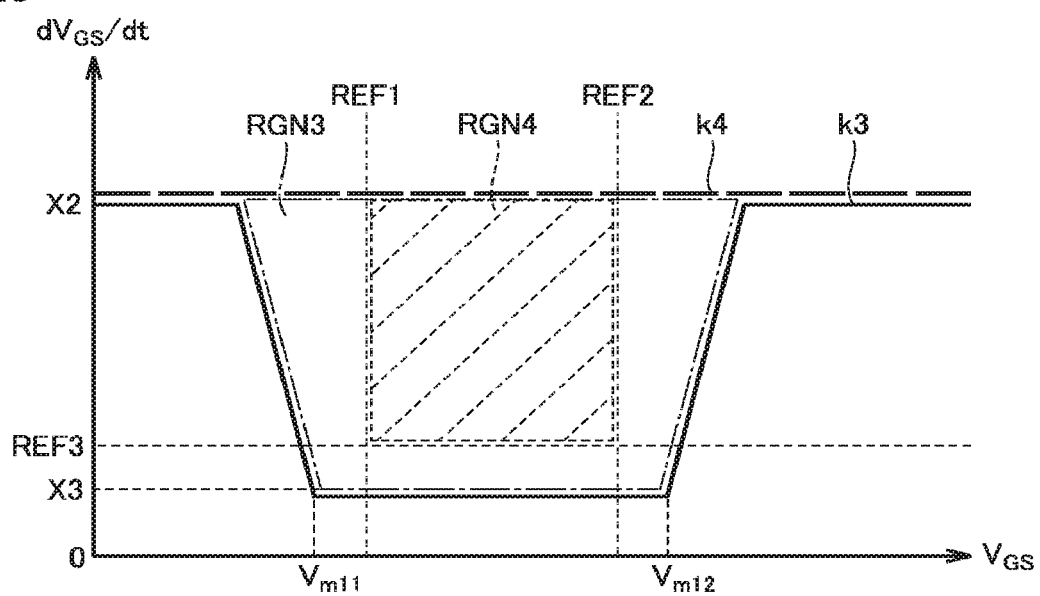
FIG. 5 is a diagram showing the relation between the gate voltage and its differential value in the turn-on operation in the SiC-MOSFET in each of the normal state and the arm short-circuit state.

FIG. 5 is a diagram showing the relation between gate voltage $V_{GS}$ and its differential value ($dV_{GS}/dt$) in the turn-on operation in the SiC-MOSFET in each of the normal state and the arm short-circuit state. A solid line k3 in the figure shows the relation between gate voltage $V_{GS}$ and its differential value in the normal state. A dashed line k4 in the figure shows the relation between gate voltage $V_{GS}$ and its differential value in the arm short-circuit state.

In FIG. 5, the relation shown by solid line k3 is derived using a differential value obtained by subjecting the waveform of gate voltage $V_{GS}$ shown by solid line L3 in FIG. 4 to time differentiation. As shown in FIG. 4, gate voltage $V_{GS}$ rises gently in a Miller period in the normal state. Thus, in the relation shown by solid line k3, the differential value before and after the Miller period is a value close to a positive value X2, and the differential value in the Miller period is a positive value X3 smaller than the differential value before and after the Miller period.

On the other hand, the relation shown by dashed line k4 is derived using a differential value obtained by subjecting the waveform of gate voltage $V_{GS}$ shown by dashed line L4 in FIG. 4 to time differentiation. In the arm short-circuit state, gate voltage $V_{GS}$ rises all at once to a gate drive power supply voltage. Accordingly, in the relation shown by dashed line k4, the differential value is kept in an approximately constant state with respect to gate voltage $V_{GS}$.

Also in the SiC-MOSFET, as in the IGBT, there is thus a significant difference between the normal state and the arm short-circuit state as to whether a Miller period appears or not in the waveform of gate voltage $V_{GS}$. As a result, also in the relation between gate voltage $V_{GS}$ and its differential value, a significant difference is to appear between the normal state and the arm short-circuit state. Therefore, using the relation between gate voltage $V_{GS}$ and its differential value, it can be determined whether the SiC-MOSFET is in a short-circuit state or not.

The following is an explanation about first reference value REF1, second reference value REF2 and third reference value REF3 that are used for determining whether power semiconductor element 101 is in a short-circuit state or not, based on gate voltage E and its differential value D in the turn-on operation of power semiconductor element 101.

In the case where power semiconductor element 101 is an IGBT, first reference value REF1, second reference value REF2 and third reference value REF3 can be set based on the relation between gate voltage $V_{GE}$ and its differential value $dV_{GE}/dt$ as shown in FIG. 3.

Particularly, in the graph showing the relation between gate voltage $V_{GE}$ and its differential value as shown in FIG. 3, reference values REF1, REF2, and REF3 are set to be included in a region surrounded by a gate voltage-differential value curve in the normal state (corresponding to solid line k1 in the figure) and a gate voltage-differential value curve in the arm short-circuit state (corresponding to dashed line k2 in the figure).

Specifically, FIG. 3 shows a trapezoidal region RGN1 surrounded by the gate voltage-differential value curve in the normal state (solid line k1) and the gate voltage-differential value curve in the arm short-circuit state (dashed line k2). Reference values REF1, REF2, and REF3 are set to be included in this region RGN1. In consideration of a detection error and the like, it is desirable that reference values REF1, REF2, and REF3 each have a fixed margin with respect to the boundary of region RGN1. For example, first reference value REF1 is set to be larger than a minimum value $V_{m1}$ of Miller voltage $V_m$ while second reference value REF2 is set to be smaller than a maximum value $V_{m2}$ of Miller voltage $V_m$. Third reference value REF3 is set to be larger than zero within region RGN1.

In this way, a region RGN2 surrounded by reference values REF1, REF2, and REF3 is set within region RGN1. In drive circuit 100, when gate voltage $V_{GE}$ and its differential value are included in this region RGN2, an output signal SS from short-circuit determination unit 110 is set at an "H" level. Thus, it can be determined that power semiconductor element 101 (IGBT) is in a short-circuit state. On the other hand, when gate voltage $V_{GE}$ and its differential value are out of this region RGN2, output signal SS from short-circuit determination unit 110 is set at an "L" level. Thus, it can be determined that power semiconductor element 101 is in a normal state.

In contrast, in the case where power semiconductor element 101 is an SiC-MOSFET, first reference value REF1, second reference value REF2 and third reference value REF3 can be set based on the relation between gate voltage $V_{GS}$ and its differential value $dV_{GS}/dt$ as shown in FIG. 5.

Particularly, in the graph showing the relation between gate voltage $V_{GS}$ and its differential value as shown in FIG. 5, reference values REF1, REF2, and REF3 are set to be included within a region surrounded by the gate voltage-differential value curve in the normal state (corresponding to solid line k3 in the figure) and the gate voltage-differential value curve in the arm short-circuit state (corresponding to dashed line k4 in the figure).

Specifically, FIG. 5 shows a trapezoidal region RGN3 surrounded by the gate voltage-differential value curve in the normal state (solid line k3) and the gate voltage-differential value curve in the arm short-circuit state (dashed line k4). Reference values REF1, REF2, and REF3 are set to be included within this region RGN3. In consideration of a detection error and the like, it is desirable that reference values REF1, REF2, and REF3 each have a fixed margin with respect to the boundary of region RGN3. For example, first reference value REF1 is set to be larger than a Miller voltage $V_{m11}$ while second reference value REF2 is set to be smaller than a Miller voltage $V_{m12}$. Third reference value REF3 is set to be larger than a positive value X3 within region RGN3.

In this way, a region RGN4 surrounded by reference values REF1, REF2, and REF3 is set within region RGN3. In drive circuit 100, when gate voltage $V_{GS}$ and its differential value are included in this region RGN4, output signal SS from short-circuit determination unit 110 is set at an "H" level. Thus, it can be determined that power semiconductor element 101 (SiC-MOSFET) is in a short-circuit state. On the other hand, when gate voltage $V_{GS}$ and its differential value are out of this region RGN4, output signal SS from short-circuit determination unit 110 is set at an "L" level. Thus, it can be determined that power semiconductor element 101 is in a normal state.

Figure 6:
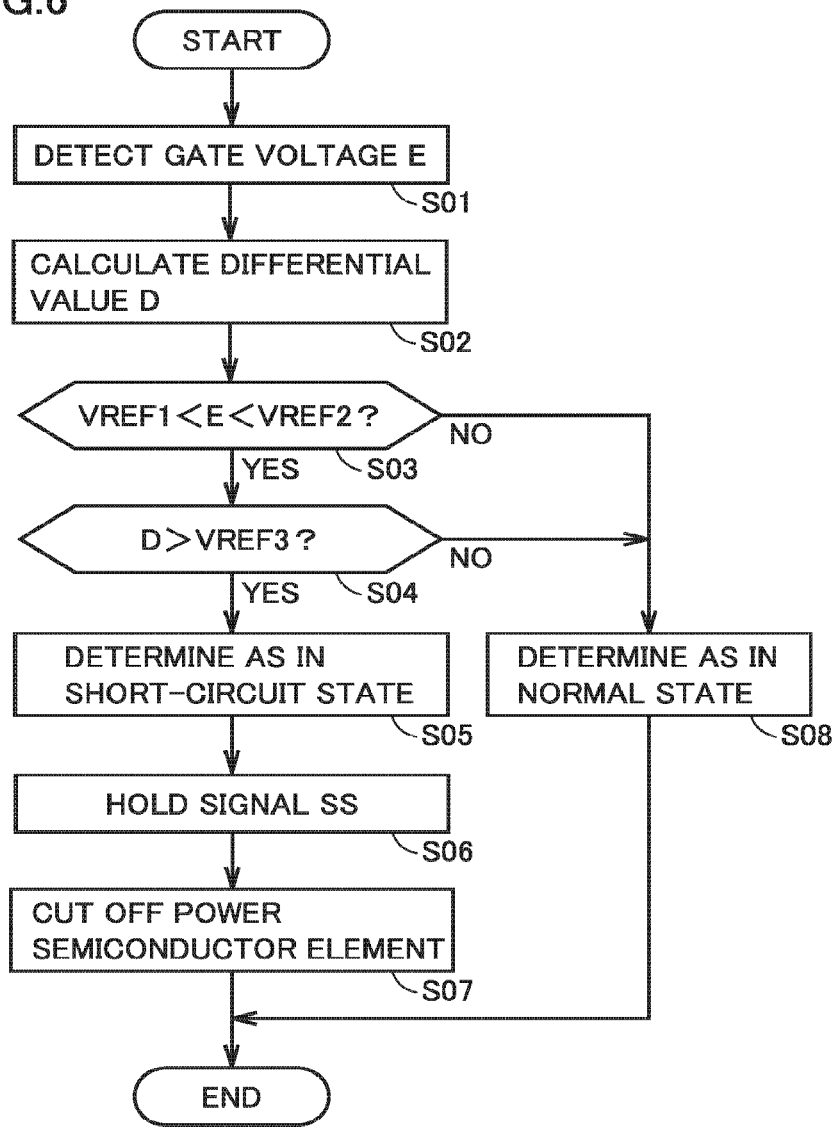
FIG. 6 is a flowchart for illustrating the process procedure of the operation of determining whether the power semiconductor element is in a short-circuit state or not.

FIG. 6 is a flowchart for illustrating the process procedure of the operation of determining whether power semiconductor element 101 is in a short-circuit state or not. The flowchart in FIG. 6 is executed by drive circuit 100 through hardware processing or software processing.

Referring to FIG. 6, in drive circuit 100, first in step S01, gate voltage detection unit 103 receives a turn-on command from control command unit 102 and subsequently detects gate voltage E applied to gate terminal 101g of power semiconductor element 101.

In step S02, differentiator 104 subjects gate voltage E detected by gate voltage detection unit 103 to time differentiation, to calculate differential value D.

First comparator 107 compares gate voltage E with each of first reference value REF1 and second reference value REF2, and outputs a signal S1 that shows a comparison result. Second comparator 109 compares differential value D with third reference value REF3 and outputs a signal S2 that shows a comparison result. Short-circuit determination unit 110 computes a logical product of signal S1 output from first comparator 107 and signal S2 output from second comparator 109, thereby determining whether power semiconductor element 101 is in a short-circuit state or not. Then, short-circuit determination unit 110 outputs signal SS that shows the determination result to control command unit 102.

When gate voltage E is higher than first reference value REF1 and lower than second reference value REF2 (determined as YES in S03), and when differential value D is greater than third reference value REF3 (determined as YES in S04), short-circuit determination unit 110 determines in step S04 that power semiconductor element 101 is in a short-circuit state, and then outputs signal SS at an "H" level. In step S06, short-circuit determination unit 110 holds signal SS at an "H" level.

Upon reception of signal SS at an "H" level from short-circuit determination unit 110, control command unit 102 outputs a turn-off command to power semiconductor element 101 in order to cut off power semiconductor element 101 in step S07.

On the other hand, when gate voltage E is equal to or less than first reference value REF1 or is equal to or greater than second reference value REF2 (determined as NO in S03), or when differential value D is equal to or less than third reference value REF3 (determined as NO in S04), short-circuit determination unit 110 determines in step S08 that power semiconductor element 101 is in a normal state, and then, outputs signal SS at an "L" level.

As described above, according to drive circuit 100 in the first embodiment of the present invention, the short-circuit state of the power semiconductor element can be determined based on gate voltage E and its differential value D of the power semiconductor element in the turn-on operation. Accordingly, when only gate voltage E in the power semiconductor element is detected, the determination operation can be performed. Thus, the short-circuit state of the power semiconductor element can be detected in a simple configuration.

Furthermore, according to drive circuit 100 in the first embodiment, the determination operation can be performed during a time period until the gate voltage rises to a gate drive power supply voltage after reception of the turn-on operation command. Thus, the short-circuit state of the power semiconductor element can be speedily detected, so that the power semiconductor element can be protected.

Furthermore, in drive circuit 100 according to the first embodiment, reference values REF1, REF2, and REF3 can be readily set also in the case where the power semiconductor element is an element having a gate voltage that is not constant in the Miller period in the same manner as with the SiC-MOSFET (see FIG. 5). Thus, the short-circuit state of the power semiconductor element can be speedily detected in a simple configuration.

In addition, the power semiconductor element is not limited to a SiC-MOSFET, but the present invention is also applicable to a power semiconductor element formed of a wide band gap semiconductor material such as gallium nitride, gallium oxide, and diamond, for example.

Second Embodiment

In the configuration having been described in the first embodiment in which the short-circuit state of the power semiconductor element is determined based on the gate voltage and its differential value, it is important to detect a gate voltage with high accuracy in order to improve the determination accuracy. In the following second to fourth embodiments, an explanation will be given with regard to the configuration example of the gate voltage detection unit for detecting a gate voltage with high accuracy.

Figure 7:
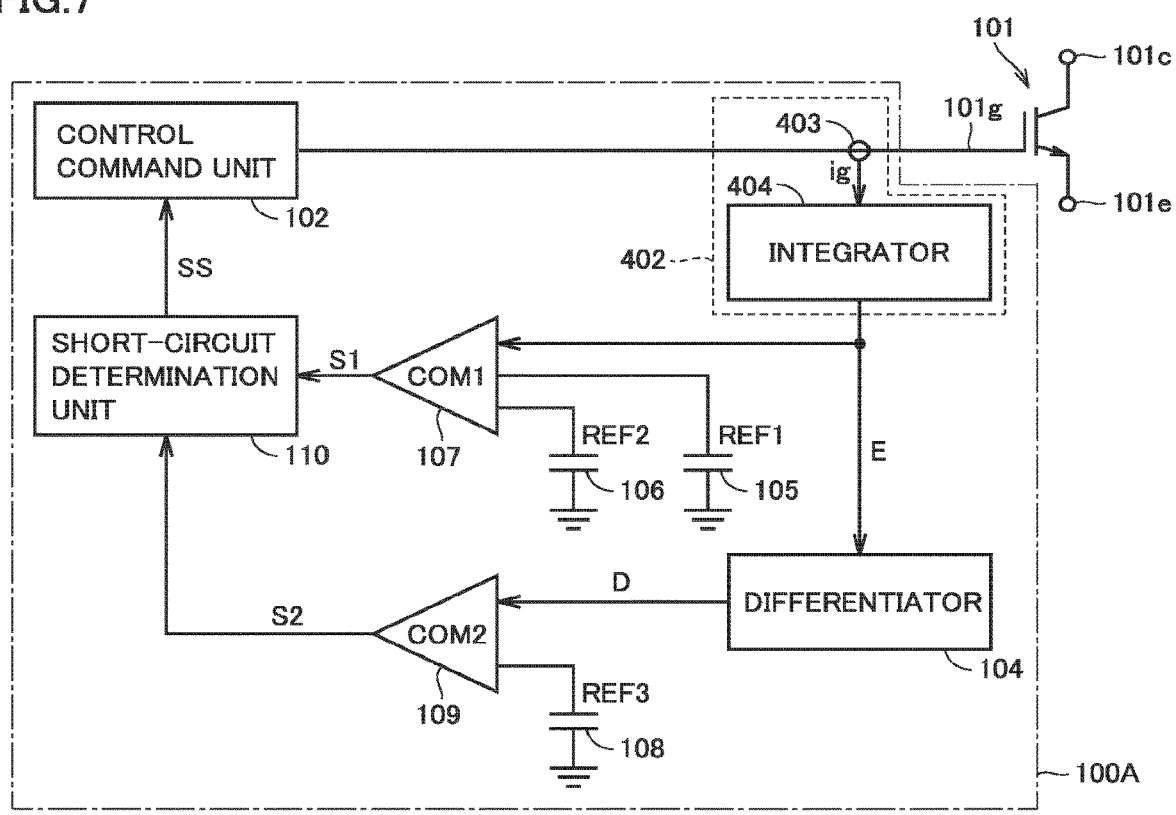
FIG. 7 is a diagram showing the configuration of a drive circuit for a power semiconductor element according to the second embodiment of the present invention.

FIG. 7 is a diagram showing the configuration of a drive circuit 100A for a power semiconductor element according to the second embodiment of the present invention.

Referring to FIG. 7, drive circuit 100A according to the second embodiment is different from drive circuit 100 shown in FIG. 1 in that it includes a gate voltage detection unit 402 in place of gate voltage detection unit 103. Since the configurations of other portions in drive circuit 100A are the same as those in drive circuit 100 in FIG. 1, the detailed description thereof will not be repeated.

Gate voltage detection unit 402 includes a current detector 403 and an integrator 404. Current detector 403 detects a gate current ig that flows into gate terminal 101g of power semiconductor element 101. Current detector 403 outputs a signal ig that shows the detected gate current. Integrator 404 subjects gate current ig detected by current detector 403 to time integration.

In this case, the relation represented by the following equation (1) is established between gate current ig that flows into gate terminal 101g of power semiconductor element 101 and gate voltage E that is applied to gate terminal 101g.

[Equation 1]

$$E = \frac{1}{C}\int ig(t)dt \quad (1)$$

In this case, C represents a parasitic capacitance component that occurs between gate terminal 101g and emitter terminal 101e (that is, gate-emitter capacitance $C_{GE}$) of power semiconductor element 101.

Using the above-mentioned equation (1), integrator 404 can calculate gate voltage E based on the integral value obtained by subjecting gate current ig to time integration. In addition, gate-emitter capacitance $C_{GE}$ has a characteristic that depends on gate-emitter voltage $V_{GE}$. Thus, as gate-emitter capacitance $C_{GE}$ in the equation (1) is set at an arbitrary constant between the maximum value and the minimum value of the function of gate-emitter voltage $V_{GE}$, gate voltage E can be calculated. Furthermore, by defining gate-emitter capacitance $C_{GE}$ in the equation (1) as a function of gate-emitter voltage $V_{GE}$, the accuracy of computing gate voltage E can be improved.

Gate voltage E computed by integrator 404 is output to first comparator 107 and differentiator 104. Thus, in short-circuit determination unit 110, the short-circuit state of power semiconductor element 101 is to be determined based on gate voltage E and its differential value D (=dE/dt).

As described above, according to drive circuit 100A in the second embodiment of the present invention, gate voltage detection unit 402 detects gate voltage E based on the integral value that is obtained by subjecting gate current ig detected by current detector 403 to time integration. Thereby, gate voltage E can be detected with high accuracy.

Specifically, in the configuration in which gate voltage E is directly detected using a voltmeter, the voltage occurring in a parasitic inductance L included in power semiconductor element 101 is superimposed on the detection value of the voltmeter. This parasitic inductance is mainly an inductance component of the wire connected to emitter terminal 101e of power semiconductor element 101. When a current variation occurs in parasitic inductance L, a voltage V represented by the following equation (2) is produced.

[Equation 2]

$$V = L\frac{di}{dt} \quad (2)$$

In this case, di/dt represents a time differential of the current that flows through parasitic inductance L.

A voltmeter cannot be placed so as to bypass this parasitic inductance L. Accordingly, the voltmeter is to detect the voltage that is obtained by superimposing the voltage that occurs in parasitic inductance L on the gate voltage that is directly applied to gate terminal 101g. Thus, the detection value of the voltmeter contains an error with respect to the gate voltage.

In contrast, in drive circuit 100A according to the second embodiment, gate voltage E is detected using the integral value that is obtained by subjecting gate current ig flowing into gate-emitter capacitance $C_{GE}$ to time integration. Thus, the above-mentioned error of the voltage caused by parasitic inductance L can be avoided, with the result that the accuracy of gate voltage E can be improved. Therefore, also when power semiconductor element 101 is switching-operated at high speed or is operated with a high current, gate voltage E can be detected with high accuracy. As a result, in the configuration in which the short-circuit state of power semiconductor element 101 is determined based on gate voltage E and its differential value D, the accuracy of determining the short-circuit state can be improved.

Third Embodiment

Figure 8:
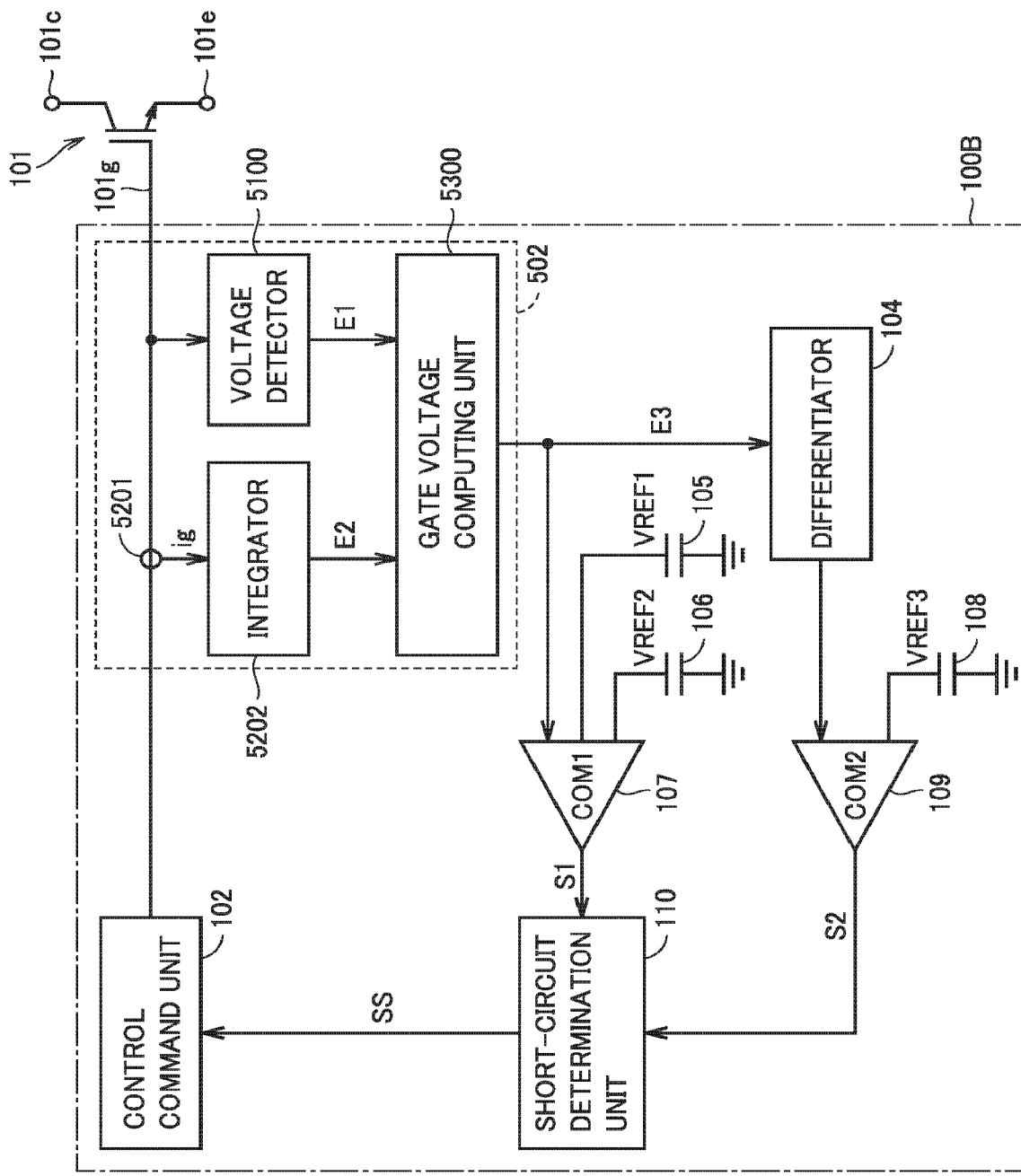
FIG. 8 is a diagram showing the configuration of a drive circuit for a power semiconductor element according to the third embodiment of the present invention.

FIG. 8 is a diagram showing the configuration of a drive circuit 100B for a power semiconductor element according to the third embodiment of the present invention.

Referring to FIG. 8, drive circuit 100B according to the third embodiment is different from drive circuit 100 shown in FIG. 1 in that it includes a gate voltage detection unit 502 in place of gate voltage detection unit 103. Since the configurations of other portions in drive circuit 100B are the same as those in drive circuit 100 in FIG. 1, the detailed description thereof will not be repeated.

Gate voltage detection unit 502 includes a voltage detector 5100, a current detector 5201, an integrator 5202, and a gate voltage computing unit 5300.

Voltage detector 5100 detects the gate voltage applied to gate terminal 101g of power semiconductor element 101. A commonly used voltmeter can be used as voltage detector 5100. Voltage detector 5100 outputs a signal E1 that shows the detected gate voltage.

Current detector 5201 detects the gate current that flows into gate terminal 101g of power semiconductor element 101. Current detector 5201 outputs a signal ig that shows the detected gate current.

Integrator 5202 subjects gate current ig detected by current detector 5201 to time integration. Using the above-mentioned equation (1), integrator 5202 calculates a gate voltage based on the integral value that is obtained by subjecting gate current ig to time integration. Integrator 5202 outputs a signal E2 that shows the calculated gate voltage. By defining gate-emitter capacitance $C_{GE}$ in the equation (1) as a function of gate-emitter voltage $V_{GE}$, the accuracy of computing gate voltage E2 can be improved.

Gate voltage computing unit 5300 performs computation using gate voltage E1 detected by voltage detector 5100 and gate voltage E2 calculated by integrator 5202, to thereby calculate the gate voltage applied to gate terminal 101g of power semiconductor element 101. Gate voltage computing unit 5300 outputs a signal E3 that shows the calculated gate voltage.

Specifically, gate voltage computing unit 5300 computes the average value of gate voltage E1 and gate voltage E2 to thereby calculate gate voltage E3. Thereby, gate voltage detection unit 502 can output gate voltage E3 having high accuracy.

Specifically, as described above, voltage detector 5100 (a voltmeter) is used to directly detect gate voltage E, which shows a detection value on which voltage V occurring in parasitic inductance L of power semiconductor element 101 (see the above-mentioned equation (2)) is superimposed. Therefore, gate voltage E1 detected by voltage detector 5100 is to be higher than the gate voltage applied to gate terminal 101g, and is to exhibit an excessively large error that is equivalent to voltage V occurring in parasitic inductance L.

On the other hand, in power semiconductor element 101, gate current ig that flows into gate terminal 101g flows into gate-emitter capacitance $C_{GE}$, so that gate-emitter capacitance $C_{GE}$ is charged. In this case, the current with which gate-emitter capacitance $C_{GE}$ is charged includes two types of currents including: a gate current ig that flows from gate terminal 101g; and a collector current ic that flows between collector terminal 101c and emitter terminal 101e. However, current detector 5201 can detect gate current ig but cannot detect collector current ic. Accordingly, the detection value by current detector 5201 is smaller than the current with which gate-emitter capacitance $C_{GE}$ is actually charged. As a result, gate voltage E2 obtained by subjecting the detection value of gate current ig to time integration is smaller than the original gate voltage. In other words, gate voltage E2 is to have an excessively small error equivalent to the charge voltage by collector current ic.

Thus, gate voltage computing unit 5300 computes the average value of gate voltage E1 having an excessively large error and gate voltage E2 having an excessively small error, thereby allowing the excessively large error and the excessively small error to substantially cancel out each other. Thereby, it becomes possible to obtain gate voltage E3 having high accuracy, from which both the excessively large error and the excessively small error are reduced.

Gate voltage E3 computed by gate voltage computing unit 5300 is output to first comparator 107 and differentiator 104. Thus, in short-circuit determination unit 110, the short-circuit state of power semiconductor element 101 is to be determined based on gate voltage E3 and its differential value D (=dE3/dt).

In the process of computing the average value of gate voltage E1 and gate voltage E2 in gate voltage computing unit 5300, gate voltage E1 and gate voltage E2 may be simply averaged or may be weight-averaged. Through weight-averaging, the weight applied to each of gate voltages E1 and E2 can be adjusted for each power semiconductor element. Thus, the accuracy of gate voltage E3 can be further improved.

As described above, according to drive circuit 100B in the third embodiment of the present invention, gate voltage E1 detected by voltage detector 5100 and gate voltage E2 calculated using the integral value of gate current ig detected by current detector 5201 are averaged to thereby calculate gate voltage E3, with the result that the gate voltage can be detected with high accuracy. Consequently, the accuracy of determining the short-circuit state can be improved in the configuration in which the short-circuit state of power semiconductor element 101 is determined based on gate voltage E3 and its differential value D.

Fourth Embodiment

Figure 9:
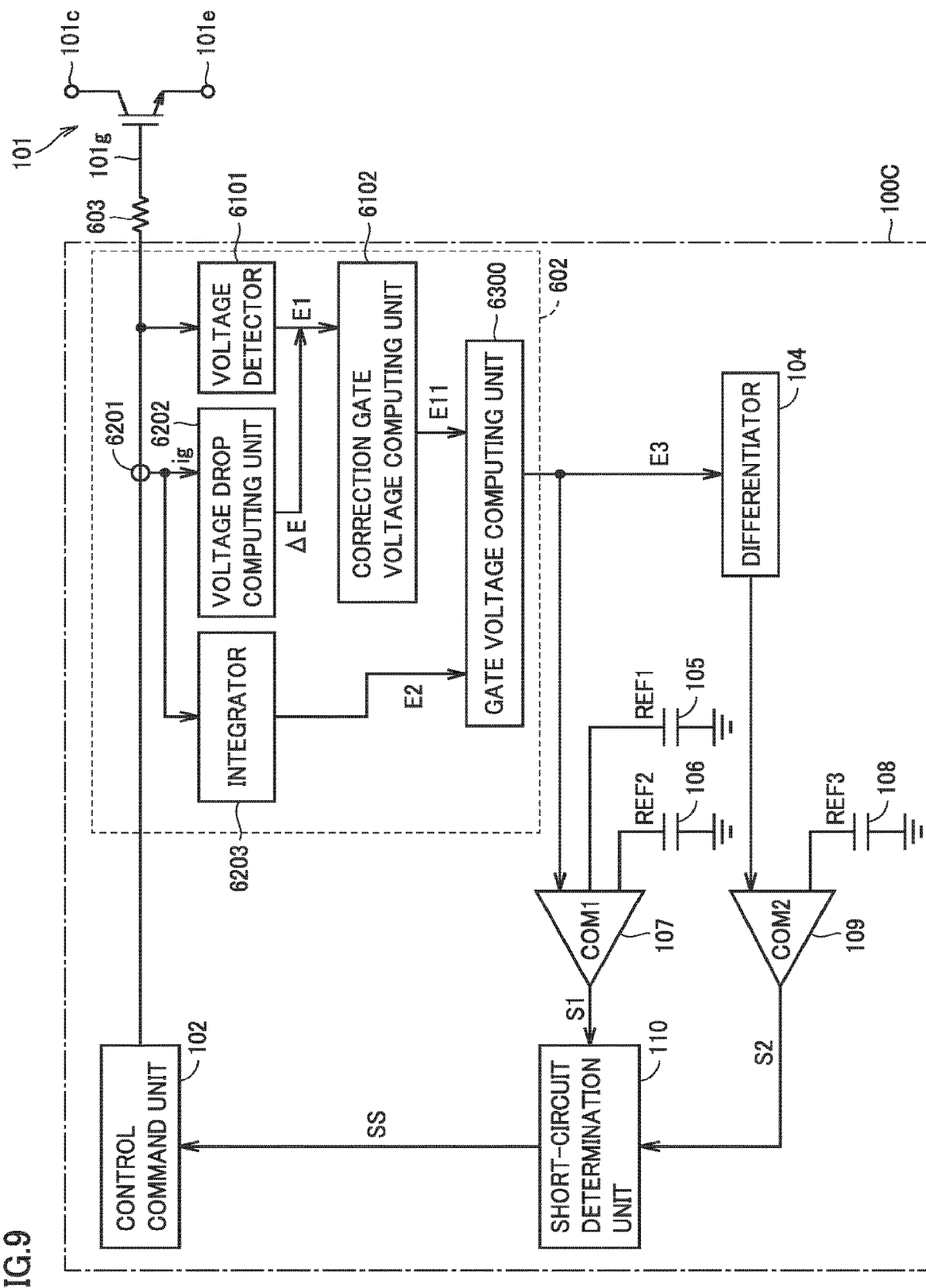
FIG. 9 is a diagram showing the configuration of a drive circuit for a power semiconductor element according to the fourth embodiment of the present invention.

FIG. 9 is a diagram showing the configuration of a drive circuit 100C for a power semiconductor element according to the fourth embodiment of the present invention.

Referring to FIG. 9, drive circuit 100C according to the fourth embodiment is different from drive circuit 100 shown in FIG. 1 in that it includes a gate voltage detection unit 602 in place of gate voltage detection unit 103. Since the configurations of other portions in drive circuit 100C are the same as those in drive circuit 100 in FIG. 1, the detailed description thereof will not be repeated.

Gate voltage detection unit 602 includes a voltage detector 6101, a current detector 6201, a voltage drop computing unit 6202, a correction gate voltage computing unit 6102, an integrator 6203, and a gate voltage computing unit 6300.

Voltage detector 6101 detects the gate voltage that is applied to gate terminal 101g of power semiconductor element 101. A commonly used voltmeter can be used as voltage detector 6101. Voltage detector 6101 outputs a signal E1 that shows the detected gate voltage.

Current detector 6201 detects the gate current that flows into gate terminal 101g of power semiconductor element 101. Current detector 6201 outputs a signal ig that shows the detected gate current.

Using detection value ig by current detector 6201, voltage drop computing unit 6202 calculates the amount of voltage drop that occurs in a gate resistance 603. Specifically, a resistance element referred to as a gate resistance may be connected to gate terminal 101g of power semiconductor element 101. Thus, when gate current ig flows into gate terminal 101g, a voltage drop occurs in gate resistance 603. Assuming that this amount of voltage drop is defined as ΔE, and the resistance value of gate resistance 603 is defined as Rg, the amount of voltage drop ΔE is represented by ΔE=ig×Rg. Voltage drop computing unit 6202 outputs a signal ΔE that shows the calculated amount of voltage drop. Voltage drop computing unit 6202 corresponds to one example of the "first computing unit" in the present invention.

Correction gate voltage computing unit 6102 subtracts the amount of voltage drop ΔE from gate voltage E1 detected by voltage detector 6101, thereby calculating a gate voltage E11 (E11=E1−ΔE). This gate voltage E11 is equivalent to the gate voltage that is obtained by correcting the voltage drop in gate resistance 603, and that is higher in accuracy than gate voltage E1. However, as having been described in the third embodiment, gate voltage E11 has an excessively large error resulting from parasitic inductance L in power semiconductor element 101. Correction gate voltage computing unit 6102 corresponds to one example of the "second computing unit" in the present invention.

Integrator 6203 subjects gate current ig detected by current detector 6201 to time integration. Using the above-mentioned equation (1), integrator 6203 calculates the gate voltage based on the integral value that is obtained by subjecting gate current ig to time integration. Integrator 6203 outputs a signal E2 that shows the calculated gate voltage. As to gate-emitter capacitance $C_{GE}$, by defining gate-emitter capacitance $C_{GE}$ in the equation (1) as a function of gate-emitter voltage $V_{GE}$, the accuracy of computing gate voltage E2 can be improved. However, as having been described in the third embodiment, gate voltage E2 has an excessively small error equivalent to the charge voltage by collector current ic.

Gate voltage computing unit 6300 performs computation using gate voltage E11 calculated by correction gate voltage computing unit 6102 and gate voltage E2 calculated by integrator 6203, thereby calculating the gate voltage applied to gate terminal 101g of power semiconductor element 101. Gate voltage computing unit 6300 outputs a signal E3 that shows the calculated gate voltage. Gate voltage computing unit 6300 corresponds to one example of the "third computing unit" in the present invention.

Specifically, gate voltage computing unit 6300 has the same configuration as that of gate voltage computing unit 5300 in drive circuit 100B shown in FIG. 8, and computes the average value of gate voltage E11 and gate voltage E2, thereby calculating gate voltage E3. Thereby, the excessively large error included in gate voltage E11 and the excessively small error included in gate voltage E2 cancel out each other, so that gate voltage E3 having high accuracy can be obtained.

Gate voltage E3 computed by gate voltage computing unit 6300 is output to first comparator 107 and differentiator 104. Thus, in short-circuit determination unit 110, the short-circuit state of power semiconductor element 101 is to be determined based on gate voltage E3 and its differential value D (=dE3/dt).

In the process of computing the average value of gate voltage E11 and gate voltage E2 in gate voltage computing unit 6300, gate voltage E11 and gate voltage E2 may be simply averaged or may be weight-averaged. Through weight-averaging, the weight applied to each of gate voltages E11 and E2 can be adjusted for each power semiconductor element. Thus, the accuracy of gate voltage E3 can be further improved.

As described above, according to drive circuit 100C in the fourth embodiment of the present invention, the gate voltage is calculated by averaging: gate voltage E11 detected by voltage detector 6101 and for which the amount of voltage drop ΔE resulting from the gate resistance is corrected; and gate voltage E2 calculated using the integral value of gate current ig detected by current detector 6201, with the result that the gate voltage can be detected with high accuracy. Consequently, the accuracy of determining the short-circuit state can be improved in the configuration in which the short-circuit state of power semiconductor element 101 is determined based on the gate voltage and its differential value.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 101 power semiconductor element, 101c collector terminal, 101e emitter terminal, 101g gate terminal, 101d drain terminal, 101s source terminal, 100, 100A to 100C drive circuit, 102 control command unit, 103, 402, 502, 602 gate voltage detection unit, 104 differentiator, 105 first reference value generation circuit, 106 second reference value generation circuit, 107 first comparator, 108 third reference value generation circuit, 109 second comparator, 110 short-circuit determination unit, 403, 5201, 6201 current detector, 404, 5202, 6203 integrator, 603 gate resistance, 5100 voltage detector, 5300, 6300 gate voltage computing unit, 6101 voltage detector, 6202 voltage drop computing unit, 6102 correction gate voltage computing unit, REF1 first reference value, REF2 second reference value, REF3 third reference value.

The invention claimed is:

1. A drive circuit for a power semiconductor element having a first terminal, a second terminal, and a gate terminal, the drive circuit comprising:
   a control command unit that outputs a turn-on command for the power semiconductor element;
   a gate voltage detection unit that detects a gate voltage applied to the gate terminal after the control command unit outputs the turn-on command;
   a differentiator that subjects the gate voltage detected by the gate voltage detection unit to time differentiation; and
   a determination unit that determines, based on a relation between the gate voltage detected by the gate voltage detection unit and a differential value by the differentiator, whether the power semiconductor element is in a short-circuit state or not.

2. The drive circuit for a power semiconductor element according to claim 1, wherein
   the determination unit outputs a signal showing a determination result to the control command unit,
   the control command unit outputs a turn-off command to the power semiconductor element when the determination unit determines that the power semiconductor element is in a short-circuit state, and
   the determination unit holds an output signal when the determination unit determines that the power semiconductor element is in a short-circuit state.

3. The drive circuit for a power semiconductor element according to claim 1, further comprising:
   a first comparator that compares the gate voltage detected by the gate voltage detection unit with each of a first reference value and a second reference value; and
   a second comparator that compares the differential value by the differentiator with a third reference value,
   wherein
   the determination unit determines, based on a comparison result of the first comparator and a comparison result of the second comparator, whether the power semiconductor element is in a short-circuit state or not.

4. The drive circuit for a power semiconductor element according to claim 3, wherein
   in a graph showing the relation between the gate voltage of the power semiconductor element and a time differential value of the gate voltage, the first reference value, the second reference value, and the third reference value are included in a region surrounded by: a gate voltage-differential value curve of the power semiconductor element in a turn-on operation in a normal state; and a gate voltage-differential value curve of the power semiconductor element in the turn-on operation in an arm short-circuit state, and
   the determination unit determines that the power semiconductor element is in a short-circuit state when the gate voltage detected by the gate voltage detection unit is greater than the first reference value and smaller than the second reference value, and when the differential value of the differentiator is greater than the third reference value.

5. The drive circuit for a power semiconductor element according to claim 1, wherein
   a voltage applied to the first terminal is higher than a voltage applied to the second terminal,
   the gate voltage detection unit includes
      a current detector that detects a gate current that flows into the gate terminal of the power semiconductor element, and
      an integrator that integrates the gate current detected by the current detector, and
   the gate voltage detection unit detects the gate voltage of the power semiconductor element based on a value obtained by dividing an integral value of the integrator by a capacitance between the gate terminal and the second terminal.

6. The drive circuit for a power semiconductor element according to claim 1, wherein
   the gate voltage detection unit includes
      a voltage detector that detects the gate voltage of the power semiconductor element,
      a current detector that detects a gate current that flows into the gate terminal of the power semiconductor element,
      an integrator that integrates the gate current detected by the current detector, and a computing unit that computes an average value of the gate voltage detected by the voltage detector and an integral value by the integrator, and the gate voltage detection unit detects the gate voltage of the power semiconductor element based on a computed value by the computing unit.

7. The drive circuit for a power semiconductor element according to claim 1, wherein a voltage applied to the first terminal is higher than a voltage applied to the second terminal, the gate voltage detection unit includes a voltage detector that detects the gate voltage of the power semiconductor element, a current detector that detects a gate current that flows into the gate terminal of the power semiconductor element, a first computing unit that computes an amount of voltage drop in a gate resistance based on a value obtained by multiplying the gate current, which is detected by the current detector, by the gate resistance, a second computing unit that subtracts the amount of voltage drop in the gate resistance from the gate voltage detected by the voltage detector, the amount of voltage drop being computed by the first computing unit, an integrator that integrates the gate current detected by the current detector, and a third computing unit that computes an average value of:

a value obtained by dividing an integral value of the integrator by a capacitance between the gate terminal and the second terminal; and a computed value by the second computing unit, and the gate voltage detection unit detects the gate voltage of the power semiconductor element based on a computed value by the third computing unit.

8. The drive circuit for a power semiconductor element according to claim 1, wherein the power semiconductor element is an IGBT.

9. The drive circuit for a power semiconductor element according to claim 1, wherein the power semiconductor element is a MOSFET.

10. The drive circuit for a power semiconductor element according to claim 9, wherein the power semiconductor element is a SiC element.

* * * * *